United States Patent
Baird et al.

(10) Patent No.: US 6,172,325 B1
(45) Date of Patent: Jan. 9, 2001

(54) LASER PROCESSING POWER OUTPUT STABILIZATION APPARATUS AND METHOD EMPLOYING PROCESSING POSITION FEEDBACK

(75) Inventors: Brian W. Baird, Oregon City; William J. Jordens; Stephen N. Swaringen, both of Beaverton, all of OR (US)

(73) Assignee: Electro Scientific Industries, Inc., Portland, OR (US)

( * ) Notice: Under 35 U.S.C. 154(b), the term of this patent shall be extended for 0 days.

(21) Appl. No.: 09/248,071

(22) Filed: Feb. 10, 1999

(51) Int. Cl.$^7$ .................................................. B23K 26/00
(52) U.S. Cl. .............................. 219/121.62; 219/121.82
(58) Field of Search ..................... 219/121.61, 121.62, 219/121.78, 121.82, 121.83, 121.85

(56) References Cited

U.S. PATENT DOCUMENTS

| | | | |
|---|---|---|---|
| 5,041,716 | 8/1991 | Wakabayashi | 219/121.68 |
| 5,260,963 | 11/1993 | Baird et al. | 372/95 |
| 5,265,114 | 11/1993 | Sun et al. | 372/69 |
| 5,287,381 | 2/1994 | Hyuga et al. | 372/75 |
| 5,317,447 | 5/1994 | Baird et al. | 359/328 |
| 5,323,414 | 6/1994 | Baird et al. | 372/75 |
| 5,453,594 | 9/1995 | Konecny | 219/121.61 |
| 5,590,141 | 12/1996 | Baird et al. | 372/10 |
| 5,751,585 | 5/1998 | Cutler et al. | 364/474.03 |

FOREIGN PATENT DOCUMENTS

| | | | |
|---|---|---|---|
| 226198 | 10/1986 | (JP) | B23K/26/08 |
| 238184 | 10/1991 | (JP) | B23K/26/00 |

Primary Examiner—Samuel M. Heinrich
(74) Attorney, Agent, or Firm—Stoel Rives LLP

(57) ABSTRACT

A Q-switched solid state laser system (24) operates in a pulse processing control system (10) that employs an autopulse mode and a pulse-on-position mode to stabilize the pulse-to-pulse laser energy delivered to a workpiece (20) that is moved by an X-Y positioner (18). In the autopulse mode, laser pulses are emitted at a near maximum PRF, but the pulses are blocked from reaching the workpiece by an external modulator (28, 32), such as an acousto-optic modulator ("AOM") or electro-optic modulator (also referred to as a Pockels cell). In the pulse-on-position mode, the laser emits a pulse in response to the positioner moving to a location on the workpiece that coincides with a commanded coordinate location. The processing control system delivers a stream of coordinate locations, some requiring processing, at a rate that moves the positioner and triggers the laser at about the near maximum PRF. The pulse processing control system sets the AOM to a transmissive state whenever a coordinate location requiring processing is commanded and otherwise sets the AOM to a blocking state. This pulse timing technique provides a nearly constant interpulse period for the laser, thereby improving its pulse-to-pulse energy stability at the near maximum PRF.

10 Claims, 2 Drawing Sheets

LASER PROCESSING POWER OUTPUT STABILIZATION APPARATUS AND METHOD EMPLOYING PROCESSING POSITION FEEDBACK

TECHNICAL FIELD

This invention relates to lasers and more particularly to a method and an apparatus for providing uniform energy laser pulses at a high pulse repetition frequency ("PRF") in on-the-fly specimen processing applications.

BACKGROUND OF THE INVENTION

Lasers are typically employed in a variety of industrial operations including inspecting, processing, and micromachining substrates, such as electronic materials. For example, to repair a dynamic random access memory ("DRAM"), a first laser pulse is used to remove an electrically conductive link to a faulty memory cell of a DRAM device, and then a second laser pulse is used to remove a resistive link to a redundant memory cell to replace the faulty memory cell. Because faulty memory cells needing link removals are randomly located, workpiece positioning delay times typically require that such laser repair processes be performed over a wide range of PRFs, rather than at a constant PRF. This production technique is referred to in the industry as on-the-fly ("OTF") link processing and allows for greater efficiency in the rate at which links on a given wafer can be repaired, thereby improving the efficiency of the entire DRAM production process.

However, it is well known that the laser energy per pulse typically decreases with increasing PRF, a characteristic that is particularly true for Q-switched, solid-state lasers. This energy per pulse roll-off limits the upper PRF range for many laser memory repair processes. Moreover, memories and other electronic components are manufactured with various processes each requiring processing by a particular range of pulse energies, often referred to as a "process window." For many memory devices, the "process window" requires that laser pulse energy vary by less than 5% from a selected pulse energy value.

Prior workers have taken various approaches for ensuring operation within a process window or for opening up the process window. For example, U.S. Pat. No. 5,590,141 for METHOD AND APPARATUS FOR GENERATING AND EMPLOYING A HIGH DENSITY OF EXCITED IONS IN A LASANT, which is assigned to the assignee of this application, describes solid-state lasers having lasants exhibiting a reduced pulse energy drop off as a function of PRF and, therefore, a higher usable PRF. Such lasers are, therefore, capable of generating more stable pulse energy levels when operated below their maximum PRF.

It is also known that laser processing applications typically employ positioners to rapidly move target locations on a workpiece through a sequence of programmed processing positions. The movements of the positioner and the laser pulse timing are asynchronous, requiring lasers in such applications to operate in an OTF mode having an inherently wide range of PRFs. The resulting wide range of interpulse periods causes corresponding pulse to pulse energy variations and indefinite pulse firing timing, which leads to inaccurate laser pulse positioning on a workpiece.

Accordingly, U.S. Pat. No. 5,453,594 for RADIATION BEAM POSITION AND EMISSION COORDINATION SYSTEM, which is assigned to the assignee of this application, describes a technique for synchronizing a clock that controls the positioner with a variable clock that controls OTF laser pulse emission. The synchronized clocks allow the laser to emit pulses in synchronism with positioner movements across target locations on the workpiece, thereby improving laser pulse positioning accuracy.

The above-described laser processing applications typically employ infrared ("IR") lasers having 1,047 nanometer ("nm") or 1,064 nm fundamental wavelengths. Applicants have discovered that many laser processing applications are improved by employing ultraviolet ("UV") energy wavelengths, which are typically less than about 500 nm. Such UV wavelengths may be generated by subjecting an IR laser to a harmonic generation process that stimulates the second, third, or fourth harmonics of the IR laser. Unfortunately, the pulse to pulse energy levels of such UV lasers are particularly sensitive to PRF and interpulse period variations.

What is needed, therefore, is an apparatus and a method for generating stable UV laser processing pulse energies at a high PRF in high-accuracy OTF laser processing applications.

SUMMARY OF THE INVENTION

An object of this invention is, therefore, to provide an apparatus and a method for generating stable laser processing pulse energy at a high PRF in high-accuracy OTF laser processing applications.

Another object of this invention is to satisfy the above object for OTF. specimen processing applications employing UV wavelengths.

A Q-switched solid state laser operates in cooperation with a pulse processing control system that employs an autopulse mode and a pulse-on-position mode to stabilize the pulse-to-pulse laser energy delivered to target locations on a workpiece that is moved by a positioner. In the autopulse mode, laser pulses are emitted at a near maximum PRF, but the pulses are blocked from reaching the workpiece by an external modulator, such as an acousto-optic modulator ("AOM") or electro-optic modulator (also referred to as a Pockels cell). In the pulse-on-position mode, the laser emits a pulse each time the positioner moves a workpiece location through coordinates that coincide with a commanded laser beam coordinate. The processing control system moves the positioner at a near constant velocity that causes triggering of the laser at about the maximum PRF in response to the workpiece passing through a regularly spaced apart set of commanded laser beam coordinates. The pulse processing control system sets the AOM to a transmissive state whenever a location to be processed is commanded and sets the AOM to a blocking state whenever a location not to be processed is commanded. This pulse timing technique provides a nearly constant interpulse period for the laser, thereby stabilizing its pulse-to-pulse energy level at the near maximum PRF.

This invention is advantageous for generating stable pulse-to-pulse laser pulse energy when processing features that ordinarily require near random interpulse periods. This invention is also advantageous for stabilizing the pulse-to-pulse energy of a Q-switched solid state laser generating frequency-doubled, -tripled, or quadrupled laser pulses by employing a nonlinear harmonic generation process.

Additional objects and advantages of this invention will be apparent from the following detailed description of preferred embodiments thereof that proceed with reference to the accompanying drawings.

DETAILED DESCRIPTION OF PREFERRED EMBODIMENTS

Figure 1:
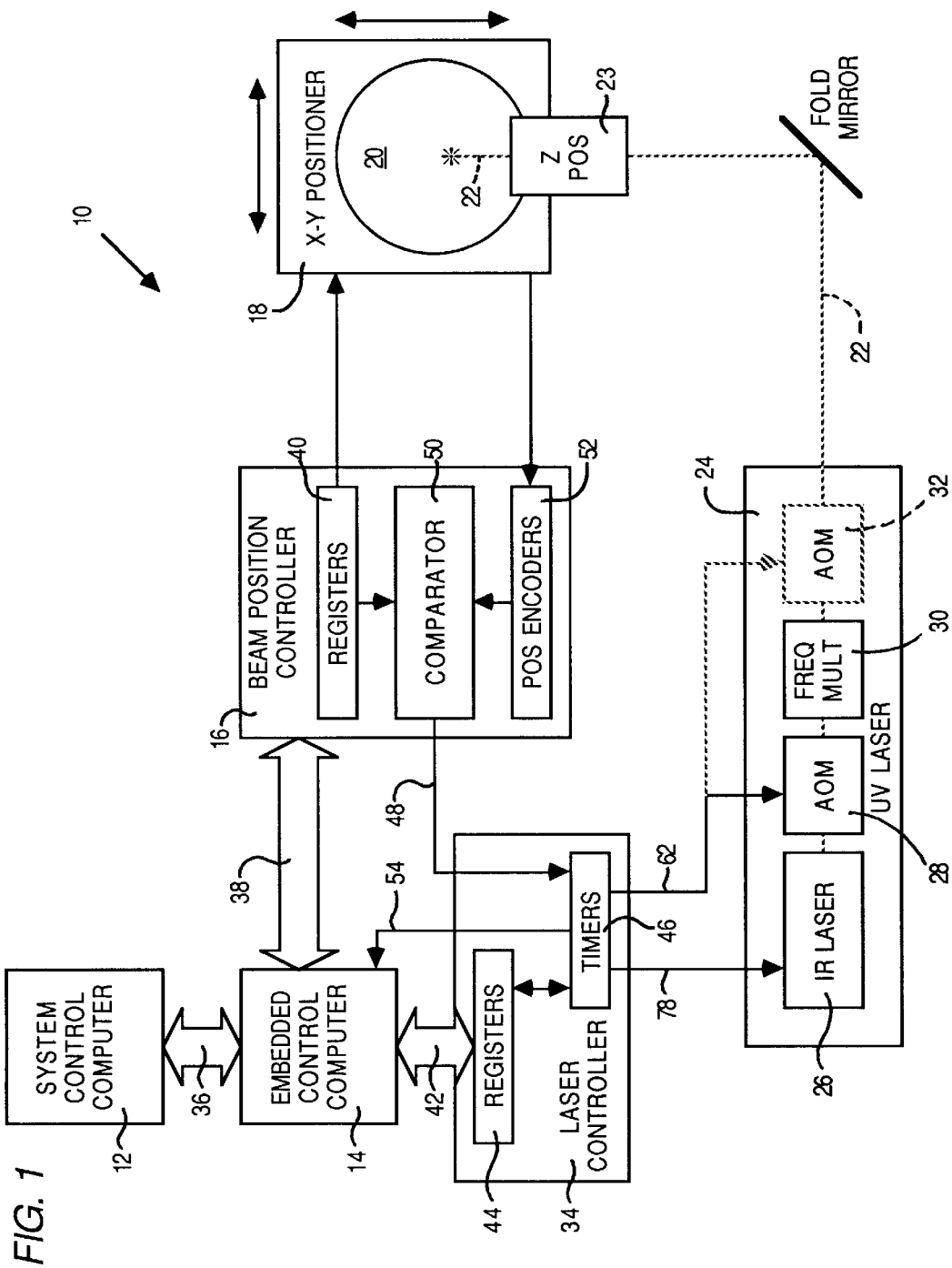
FIG. 1 is a schematic block diagram showing a workpiece positioner and a laser processing control system interconnected according to this invention.

FIG. 1 shows a laser pulse processing control system 10 of this invention in which a system control computer 12 and an embedded control computer 14 coact to control a beam position controller 16 that receives position information from an X-Y positioner 18 that positions a workpiece 20 relative to a UV laser beam 22. UV laser beam 22 may propagate through various optical elements (not shown) in addition to the fold mirror that is shown. X-Y positioner 18 may also include a Z positioner 23 that may be coupled to either the X or Y stage. X-Y positioner 18 is preferably based on a positioning system described in U.S. Pat. No. 5,751,585 for HIGH SPEED, HIGH ACCURACY MULTI-STAGE TOOL POSITIONING SYSTEM, which is assigned to the assignee of this application. A commercial example of a laser pulse processing control system suitable for use with this invention is the Model 9300 Memory Yield Improvement System manufactured by Electro Scientific Industries, Inc. of Portland, Oreg., the assignee of this application.

A UV laser system 24 preferably includes a Q-switched solid state IR laser 26, such as a diode-pumped, acousto-optically Q-switched Nd:YV0$_4$ laser; an AOM 28 for modulating the pulse amplitude of IR laser 26; and a frequency multiplier 30 for converting the infrared wavelength emissions from IR laser 26 into green and/or UV wavelengths by employing well-known second, third, or fourth harmonic conversion processes. AOM 28 may be alternatively positioned after frequency multiplier 30 as indicated by the position of an AOM 32 shown in phantom lines. In either embodiment, a laser controller 34 controls the transmissivity of AOM 28 or 32 to transmit or block UV laser beam 22 directed toward workpiece 20.

System control computer 12 conveys across a bus 36 into embedded control computer 14 position coordinates of workpiece 20 locations requiring laser processing. In a typical specimen processing application, workpiece 20 includes regularly spaced apart device structures, such as fusible links, only some of which require processing. The locations requiring processing are referred to as target locations, and the locations not requiring processing are referred to as intermediate locations. Embedded control computer 14 adds to the target location coordinates intermediate location coordinates that are spaced apart to trigger IR laser 26 at nearly equal time intervals. Embedded control computer 14 conveys the target and intermediate position coordinates one at a time at a predetermined rate across a bus 38 to registers 40 in beam position controller 16 and simultaneously loads control data across a bus 42 to registers 44 in laser controller 34. The predetermined rate controls the movement velocity of X-Y controller 18, and the control data indicate whether the coordinate location is a target location to be processed and further includes mode and timing information.

Laser controller 34 operates timers 46 in either an autopulse mode or a pulse-on-position mode. In autopulse mode, timers 46 start in response to the control data in registers 44; and, in the pulse-on-position mode, timers 46 start in response to receiving a position coincidence signal 48 from a comparator 50 in beam position controller 16. Position encoders 52 in beam position controller 16 indicate to comparator 50 the current position of X-Y positioner 18, and when the current position matches the position coordinates stored in registers 40, position coincidence signal 48 is generated indicating that workpiece 20 is properly positioned over a target position or an intermediate position. Accordingly, if workpiece 20 has been positioned over a target position, timers 46 simultaneously operate the Q-switch in IR laser 26 and set AOM 28 to a transmissive state until a cycle done interrupt 54 is conveyed from timers 46 to embedded control computer 14. The transmissivity of AOM 28 is preferably controllable as either a laser pulse gating device or as a pulse amplitude modulator.

The pulse-to-pulse energy level stability of UV laser system 24 directly depends on the pulse-to-pulse energy level stability of IR laser 26. To meet this requirement, the interpulse period between emitted laser pulses is made substantially equal. This reduces thermal and radiant effects that would otherwise be caused by laser duty cycle variations arising from firing IR laser 26 at varying interpulse periods. Such thermal and radiant effects can include changes to the refractive indices of the nonlinear crystals, thereby modifying the phase-matching conditions for harmonic generation, which causes large variations in the harmonic output energy. Such thermal and radiant effects can also cause the energy per pulse of IR laser 26 to vary which will then cause the output of UV laser system 24 to fluctuate.

This invention provides nearly equal interpulse timing periods for IR laser 26 in either the autopulse or pulse-on-position modes. During the autopulse mode, AOM 28 prevents UV laser beam 22 from processing workpiece 20. During the pulse-on-position mode, position coincidence signal 48 and the target location data in registers 44 determine the transmissive state of AOM 28 and, therefore, which UV laser beam 22 pulses process workpiece 20.

Figure 2:
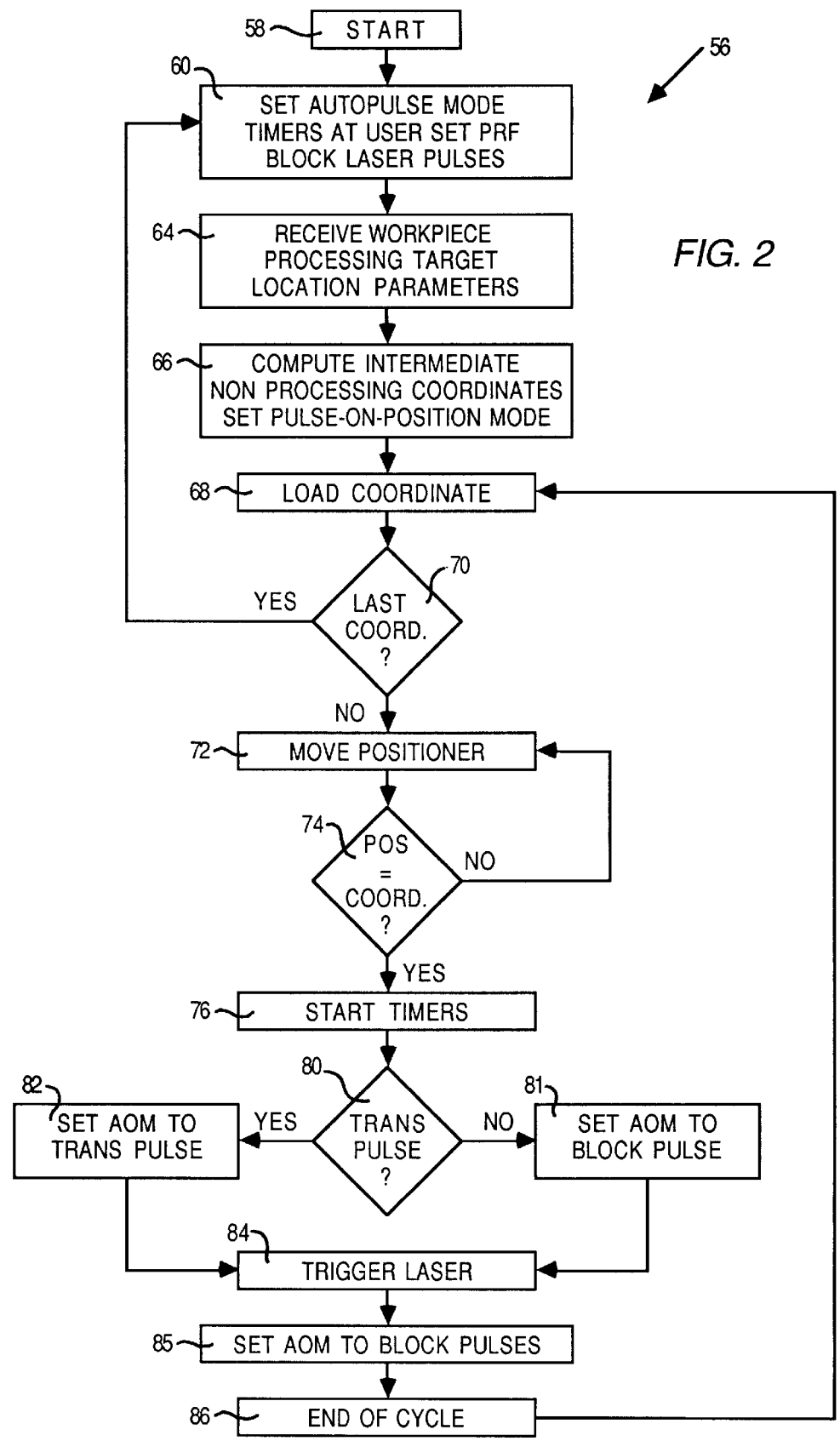
FIG. 2 is a process flow diagram showing the functional steps carried out by this invention to provide stable pulse-to-pulse UV laser energy in an autopulse mode and a pulse-on-position processing mode.

Further referring to FIG. 2, a workpiece process 56 carried out by this invention provides stable pulse-to-pulse UV laser system 24 processing energy to target locations on workpiece 20.

A start block 58 represents the start of workpiece process 56.

An autopulse mode block 60 represents embedded control computer 14 setting control system 10 to a default autopulse mode in which timers 46 trigger IR laser 26 at a user programmable PRF.

In autopulse mode, logic in timers 46 set a pulse block signal line 62 true to gate AOM 28 off, thereby preventing a usable amount of energy emitted by UV laser system 24 from reaching workpiece 20.

When control system 10 prepares to initiate a pulse-on-position processing run, a coordinate receiving block 64 represents embedded control computer 14 receiving from system control computer 12 target location coordinates on workpiece 20 requiring laser processing.

An intermediate coordinate computing block 66 represents embedded control computer 14 adding to the target location coordinates intermediate location coordinates not requiring laser processing. The intermediate location coordinates are spaced apart to cause triggering of IR laser 26 at a uniform PRF. Embedded control computer 14 switches control system 10 from autopulse mode to a pulse-on-position mode.

A coordinate loading block 68 represents embedded control computer 14 conveying across bus 38 to registers 40 a location coordinate and conveying across bus 42 to laser controller 34 pulse-on-position mode enabling data. Pulse block signal line 62 continues to cause AOM 28 to block UV laser system 24 pulse energy from being transmitted to work piece 20.

A last coordinate decision block 70 represents checking to determine whether the location coordinate is a run terminating location coordinate in the current OTF processing run. If it is, the process returns to autopulse mode block 60.

Otherwise, the process continues to a positioner moving block 72 that represents moving beam positioner 18 in response to the location coordinate.

A position comparison decision block 74 represents comparing data in position encoders 52 to the location coordinate stored in registers 40, and when the data and coordinate match, causing comparator 50 to issue position coincidence signal 48.

A timer starting block 76 represents starting timers 46 in response to receiving position coincidence signal 48. After a predetermined time period, timers 46 will drive a Q-switch gating line 78 to trigger a laser pulse from IR laser 26 for a predetermined time period (user programmable to meet process window requirements).

Before timers 46 time out, a pulse transmitting decision block 80 represents setting AOM 28 to a laser pulse blocking state 81 or a laser pulse transmitting state 82 in response to the states of position coincidence signal 48 and pulse block signal line 62.

A laser triggering block 84 represents triggering IR laser 26 in response to the Q-switch gating line signal generated in response to timer starting block 76. This timing sequence allows AOM 28 to settle to a programmed transmissivity level before Q-switch gating line 78 causes IR laser 26 to emit a pulse.

After emission of the pulse, a pulse blocking block 85 represents setting AOM 28 to a transmissivity level that blocks laser pulses.

An end of cycle block 86 represents generating cycle done interrupt 54 in response to Q-switch gating line 78 returning to the pulse inhibiting state. Cycle done interrupt 54 causes workpiece processing process 56 to return to coordinate loading block 68, which represents causing embedded control computer 14 to load next coordinate location into registers 40.

As indicated above, last coordinate decision block 70 represents checking to determine whether the location coordinate is the last location coordinate in the current OTF processing run. If it is, the OTF processing run is complete and workpiece processing process 56 returns to autopulse mode block 60. Embedded control computer 14 returns laser controller 34 to the autopulse mode, any further position coincidence signals 48 are ignored, and pulse block signal line 60 is set to inhibit UV laser system 24 pulses from reaching workpiece 20.

In a typical OTF processing run, a linear row of workpiece locations is selectively processed in the pulse-on-position mode, after which control system 10 switches to autopulse mode, loads a next linear row of workpiece locations, returns to pulse-on-position mode, and repeats until the workpiece is completely processed.

Timers 46 are set up according to the following laser operating guidelines. A period $\tau_p$ represents a targeted interpulse period and therefore the maximum PRF at which laser pulses may be emitted by UV laser system 24 for delivery to workpiece 20. The PRF value is user-selectable up to a maximum value that is typically limited by the time required by X-Y positioner 18 to move between target locations. A period $\tau$ represents the actual interpulse period between adjacent commanded pulses. Timers 46 produce values of $\tau$ that equal $\tau_p$ in autopulse mode and approximately equal $\tau_p$ when in pulse-on-position feedback mode. A period $\tau_t$ represents a transition interpulse period, which is the period between pulses while control system 10 is switching modes. Transition interpulse period, $\tau_t$ may have an arbitrary value between 0 and $\tau_p$ that causes IR laser 26 to emit a pulse having an indefinite pulse energy. Accordingly, during transition interpulse period $\tau_t$, pulse block signal line 62 is set true to block transmission of any pulses through AOM 28 to workpiece 20.

In autopulse mode, IR laser 26 fires repetitively at the predetermined PRF because registers 44 set timers 46 to time out, fire IR laser 26, reset, and start over; whereas during the pulse-on-position mode, whenever IR laser 26 fires, timers 46 are reset.

Skilled workers will recognize that portions of this invention may be implemented differently from the implementations described above for preferred embodiments. For example, system control computer 12 and embedded control computer 14 may be combined into a single processor and beam positioner controller 16 and laser controller 34 may be implemented as some combination of hard-wired digital logic, programs executing in a signal processor, microprocessor, state machine, and analog circuitry. IR laser 26 may alternatively be a Nd:YLF laser having a 1,047 nm fundamental wavelength or a Nd:YAG laser having a 1,064 nm fundamental wavelength, and frequency multiplier 30 may accordingly generate the second, third, and fourth harmonics (524 nm, 349 nm, and 262 nm) of the Nd:YLF laser or the second, third, and fourth harmonics (532 nm, 355 nm, and 266 nm) of the Nd:YAG laser. Of course, the workpiece may be virtually any material or component requiring laser processing. Similarly, skilled workers will recognize that it may be possible that the workpiece 20 could be most effectively processed by an infrared wavelength, in which case output from IR laser 26 would be directed to workpiece 20 without frequency conversion to any of the above described harmonic wavelengths.

It will be obvious to those having skill in the art that many changes may be made to the details of the above-described embodiments of this invention without departing from the underlying principles thereof. Accordingly, it will be appreciated that this invention is also applicable to laser applications other than those found in processing electronic components. The scope of the present invention should, therefore, be determined only by the following claims.

What is claimed is:

1. In a laser-based workpiece processing system in which a processing control system causes a solid-state laser to emit light pulses and a positioning system to control movement of the light pulse emissions relative to a workpiece so that they impinge on target locations for processing on the workpiece, a method of providing light pulses of uniform pulse energy that serially impinge on multiple target locations intended for processing on the workpiece, comprising:

initiating a workpiece nonprocessing mode to generate in response to the processing control system a series of laser light pulse emissions at an autopulse pulse repetition rate;

blocking the light pulse emissions at the autopulse pulse repetition rate from impinging on the workpiece;

switching from the workpiece nonprocessing mode to a workpiece processing mode in which the processing control system directs to the positioning mechanism a pulse position control signal that causes the positioning mechanism to move at a positioning rate, the pulse position control signal representing spaced-apart laser pulse emission command coordinates corresponding to workpiece target locations and workpiece intermediate locations between successive workpiece target locations, and in which the processing control system causes the laser light pulse emissions at a target location pulse repetition rate determined by coincidences between the laser pulse emission command coordinates and the workpiece target and workpiece intermediate locations as the positioning mechanism moves at the positioning rate; and transmitting the laser light pulse emissions when the laser pulse emission command coordinates coincide with the workpiece target locations but otherwise blocking transmission of the laser light pulse emissions to provide, as a consequence of continually generating light pulse emissions at the autopulse and target location pulse repetition rates, the light pulses of uniform pulse energy to the workpiece target locations.

2. The method of claim 1 in which the solid-state laser comprises an infrared laser.

3. The method of claim 1 in which the solid-state laser comprises an infrared laser operating in a nonlinear harmonic generation mode to generate the laser pulses at a wavelength less than about 500 nm.

4. The method of claim 1 in which the autopulse pulse repetition rate and the target location pulse repetition rate are substantially equal.

5. The method of claim 1 in which at least one of the autopulse pulse repetition rate and the target location pulse repetition rate is user settable to a predetermined pulse repetition rate.

6. The method of claim 4 in which the autopulse pulse repetition rate and the target location pulse repetition rate are substantially equal to a maximum pulse repetition rate of the solid-state laser.

7. The method of claim 1 in which the switching from the workpiece nonprocessing mode to a workpiece processing mode produces an indeterminate transition period during which a light pulse emission is generated, the method further comprising blocking from impinging on the workpiece the light pulse emission generated during the indeterminate transition period.

8. The method of claim 1 in which the workpiece is supported on the positioning system.

9. The method of claim 1 in which the workpiece is fixed and the positioning system moves the laser light pulse emissions.

10. The method of claim 1 in which the workpiece is moved in a first axis direction fixed and the laser light pulse emissions are moved in a second axis direction.

* * * * *